United States Patent [19]

Miyakawa et al.

[11] Patent Number: 5,524,283
[45] Date of Patent: Jun. 4, 1996

[54] PORTABLE TRANSCEIVER INTEGRATED ON A PRINTED CIRCUIT BOARD

[75] Inventors: Akihisa Miyakawa, Koganei; Satoshi Fukuchi, Tachikawa, both of Japan

[73] Assignee: Hitachi Denshi Kabushiki Kaisha, Tokyo, Japan

[21] Appl. No.: 215,621

[22] Filed: Mar. 22, 1994

[30] Foreign Application Priority Data

Mar. 26, 1993 [JP] Japan .................................. 5-092238
Dec. 25, 1993 [JP] Japan .................................. 5-347544

[51] Int. Cl.$^6$ ............................................... H04B 1/10
[52] U.S. Cl. ........................... 455/90; 455/310; 455/347; 361/752; 361/814
[58] Field of Search .............................. 455/89, 90, 333, 455/347, 351, 128, 334, 349; 361/814, 816, 736, 752, 758

[56] References Cited

U.S. PATENT DOCUMENTS

| | | | |
|---|---|---|---|
| 4,648,125 | 3/1987 | Brown | 455/90 |
| 5,033,109 | 7/1991 | Kawano et al. | 455/90 |
| 5,239,685 | 8/1993 | Moe et al. | 455/333 |
| 5,239,689 | 8/1993 | Fukuda | 455/73 |
| 5,276,915 | 1/1994 | Marko et al. | 455/86 |
| 5,307,503 | 4/1994 | Okada et al. | 361/816 |
| 5,307,508 | 4/1994 | Rollins et al. | 455/90 |
| 5,369,552 | 11/1994 | Barnes et al. | 361/816 |

*Primary Examiner*—Andrew I. Faile
*Attorney, Agent, or Firm*—Antonelli, Terry, Stout & Kraus

[57] ABSTRACT

A radio apparatus including a circuit board and a housing in which the circuit board is mounted. An antenna portion, a receiving portion, and a transmitting portion are disposed on the circuit board. The transmitting portion includes a carrier-wave oscillator. The receiving portion includes a high-frequency section, a first intermediate frequency section, a second intermediate frequency section, and a first local oscillator. The high-frequency section, the first intermediate frequency section, the second intermediate frequency section, and the transmitting portion are disposed on the circuit board so as to surround the first local oscillator and the carrier-wave oscillator. The high-frequency section, the first intermediate frequency section, and the second intermediate frequency section each include a filter having an input terminal and an output terminal, and an amplifier having an input terminal and an output terminal. The input terminal of the filter, the output terminal of the filter, the input terminal of the amplifier, and the output terminal of the amplifier are arranged substantially in a straight line such that a distance between the input terminal of the filter and the output terminal of the filter is maximized and a distance between the input terminal of the amplifier and the output terminal of the amplifier is maximized.

15 Claims, 3 Drawing Sheets

PORTABLE TRANSCEIVER INTEGRATED ON A PRINTED CIRCUIT BOARD

BACKGROUND OF THE INVENTION

This invention relates to an arrangement of components mounted on a circuit board for use in a radio apparatus.

The conventional radio apparatus has a plurality of circuits mounted on a circuit board 1 as shown in FIG. 3. This circuit board 1 has dimensions of, for example, 80 mm×57 mm.

First, the construction and operation of the receiver section of the radio apparatus will be described. Referring to FIG. 3, a high-frequency signal received by an antenna 2 is supplied through a low-pass filter 3 and through an antenna switch 4 to a band-pass filter 5 where its frequency band is limited. The signal from the band-pass filter 5 is amplified by a high-frequency amplifier 6, and then supplied to a bandbass filter 7 where its frequency band is further limited. The signal from this band-pass filter 7 is supplied to a first mixer 8. On the other hand, a data signal indicating a frequency division ratio or the like which determines the oscillation frequency, i.e., an oscillation frequency specifying signal 22, is supplied to a phase-synchronization loop circuit 19 through a connector 21 from another circuit board (not shown) on which an audio signal circuit and a control circuit are mounted. The phase-synchronization loop circuit 19 responds to the signal 22 to control the oscillation frequency of a first local oscillator 18. The output signal from the first local oscillator 18 is supplied to the first mixer 8. The high-frequency signal fed to the first mixer 8 is thus converted into a first intermediate frequency signal having a certain lower frequency. The circuits from the low-pass filter 3 to the first mixer 8 constitute the receiver's high-frequency section for receiving the high-frequency signal.

The first intermediate frequency signal from the first mixer 8 is supplied to a band-pass filter 9 where its frequency band is limited. The band-limited signal from the band-pass filter 9 is amplified by a first intermediate frequency amplifier 10, and then supplied to a second mixer 11. The second mixer 11 is also supplied with a signal from a second local oscillator 12, and thus the first intermediate frequency signal is converted to a second intermediate frequency signal having a still lower frequency. The frequency band of the second intermediate frequency signal is by a band-pass filter 13, amplified by a second intermediate frequency amplifier 14, and then demodulated by a demodulator 15. The demodulated signal 24 is output from the circuit board 1 through the connector 21. The circuits from the first mixer 8 to the demodulator 15 constitute the receiver's intermediate frequency section for handling the intermediate frequency signals. Particularly the circuits from the first mixer 8 to the second mixer 11 constitute a first intermediate frequency section for handling the first intermediate frequency signal, and the circuits from the second mixer 11 to the demodulator 15 constitute a second intermediate frequency section for handling the second intermediate frequency signal.

The construction and operation of the transmitter section of the radio apparatus will now be described. Referring to FIG. 3, the oscillation frequency of a carrier-wave oscillator 20 is controlled by the phase-synchronization loop circuit 19 in response to the oscillation frequency specifying signal 22 which is supplied through the connector 21. A carrier signal generated in the carrier-wave oscillator 20 is modulated by a modulation signal 23 which is supplied through the connector 21. Amplitude of the modulated carrier-wave signal is controlled by an automatic power controller 16, amplified by a power amplifier 17 up to a specified transmission power, and then supplied through the antenna switch 4 to the low-pass filter 3 in which unnecessary frequency components are removed. The modulated carrier-wave signal with unnecessary frequency components removed is transmitted through the antenna 2.

In the arrangement of the receiver's high-frequency section mounted on the circuit board 1 as shown in FIG. 3, the high-frequency signal flows turning at right angles at the antenna switch 4, band-pass filter 5 and band-pass filter 7. Under this arrangement of the circuits, the input and output terminals of each of the band-pass filters 5 and 7 become close to each other, and thus the coupling coefficient between the signals flowing at the input and output terminals is great. Consequently, sufficient attenuation cannot be obtained as shown in FIG. 5 at (2). In addition, the output of the high-frequency amplifier 6 will be positively fed back to the input, so that there is the possibility that an undesirable oscillation is caused by the positive feedback. In other words, this deteriorates the reception sensitivity and the spurious-response ratio at the first image frequency or the like which are important characteristics of the receiver.

Similarly, the receiver's intermediate frequency sections also cause similar deterioration. That is, in the first intermediate frequency section, the attenuation in the band-pass filter 9 becomes insufficient and undesirable oscillation may occur in the first intermediate frequency amplifier 10 at the first intermediate frequency, leading to deterioration in the reception sensitivity and the spurious-response ratio at the second image frequency of the receiver. In the second intermediate frequency section, the attenuation in the band-pass filter 13 becomes insufficient and undesirable oscillation may occur in the second intermediate frequency amplifier 14 at the second intermediate frequency, leading to deterioration in reception sensitivity and other characteristics of the receiver.

Moreover, on the circuit board 1 shown in FIG. 3, the low-pass filter 5, high-frequency amplifier 6 and band-pass filter 7 are disposed close to the line on which a high-power signal is produced from the power amplifier 17, and the carrier-wave oscillator 20 and the automatic power controller 16 are disposed for away from each other so that signal lines connecting them become long. Therefore, the various circuits interfere with each other, probably causing their characteristics to degrade or causing self-oscillation upon transmission.

FIG. 4 shows the cross-sectional view of a radio apparatus including the circuit board 1. On both sides of the circuit board 1, there are mounted components such as a variable resistor 32 and a trimmer capacitor 33 which are necessary to adjust, large-height components 34 such as coils, capacitors, TCXO, various filters, power amplifiers and hybrid integrated circuits, small-height components 36 such as chip-type resistors, chip-type capacitors and thin-type integrated circuit chips. This circuit board 1 is fixed to a chassis or housing 30 with screws 31. Since the components such as the variable resistor 32 and trimmer capacitor 33 which are necessary to adjust are mounted on both sides of the circuit board 1 as described above, either some apertures for adjustment are required to be bored in the housing 30, or the components which are to be mounted on the lower side and necessary to adjust are provided with the capability of being adjusted from the bottom and apertures for adjustment are bored in the circuit board 1. The former case makes the cost of machining the housing 30 increase, while the latter case undesirably decreases the mounting area of the circuit board 1. Furthermore, since the large-height components 34 are mounted on both sides of the circuit board 1, it will be obvious that the circuit board 1 and the housing 30 must be separated by the height of those components or more. Thus, the height or thickness 35 of the whole radio apparatus increases to, for example, 17 mm, which is too thick for the radio apparatus to be used as a portable radio apparatus.

Thus, the conventional radio apparatus has the following problems with its packaging structure.

(1) Since the input and output terminals of certain filters and amplifiers of the receiver are close to each other, the coupling coefficients between the signals at the input and output terminals are large, so that the attenuation of the filters becomes insufficient and undesirable oscillation occurs in the amplifiers. Therefore receiver characteristics such as the reception sensitivity and the spurious-response ratio at the first and second image frequencies are deteriorated.

(2) Since certain circuits of the receiver are disposed near to the line on which the high-power signal is produced from the power amplifier of the transmitter and certain circuits are connected together by long signal lines, the various circuits interfere with each other, such that the characteristics of the circuits of the receiver are degraded and self-oscillation is caused upon transmission.

(3) Since the components which are necessary to adjust are mounted on both sides of the circuit board, they make not only the adjustment inconvenient but also the machining cost of the housing increase or the mounting area of the circuit board undesirably decrease.

(4) Since the large-height components and small-height components are mounted on both sides of the circuit board, the whole circuit board thickness is increased and a useless space is created so that it is difficult to make the apparatus small.

SUMMARY OF THE INVENTION

Accordingly, it is the first object of the invention to provide a radio apparatus with excellent characteristics and capable of minimizing the coupling coefficient between signals and the effects of the transmitter and receiver on each other and preventing the characteristics of the transmitter and receiver from being deteriorated. It is the second object of the invention to provide a radio apparatus with easy adjustments. It is the third object of the invention to provide a radio apparatus which is increased in its packaging density, and is very thin and small-sized.

According to the invention, the receiver's first local oscillator and carrier-wave signal oscillator are disposed at about the center of the circuit board, and the receiver section and the transmitter section are disposed around those oscillators. The receiver's high-frequency section and the receiver's intermediate frequency sections are each arranged substantially in a straight line. In addition, the components such as trimmer capacitors and variable resistors which are necessary to adjust are disposed on the same side of the circuit board. Moreover, components of substantially an equal height are mounted on one side of the circuit board.

Therefore, this invention can make the most effective use of the performance of each circuit which constitutes the transmitter and receiver, and eliminate the mutual interference between the transmitter and the receiver, thus increasing the stability of the radio apparatus. In addition, the radio apparatus of the invention can have easy adjustments, be produced at low cost and be small-sized.

DESCRIPTION OF THE PREFERRED EMBODIMENTS

Figure 1:
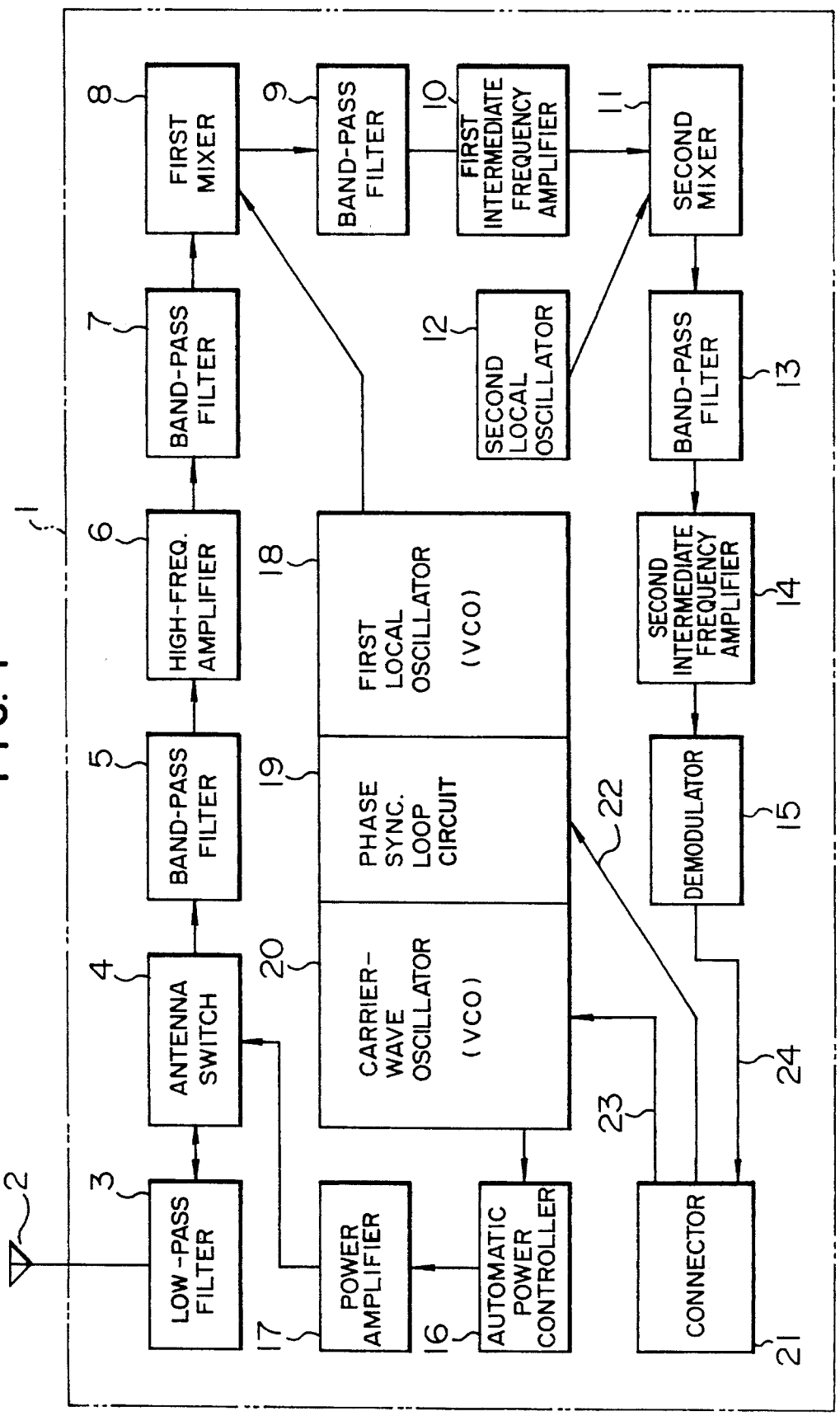
FIG. 1 is a circuit block diagram of one embodiment of the radio apparatus of the invention.
Figure 3:
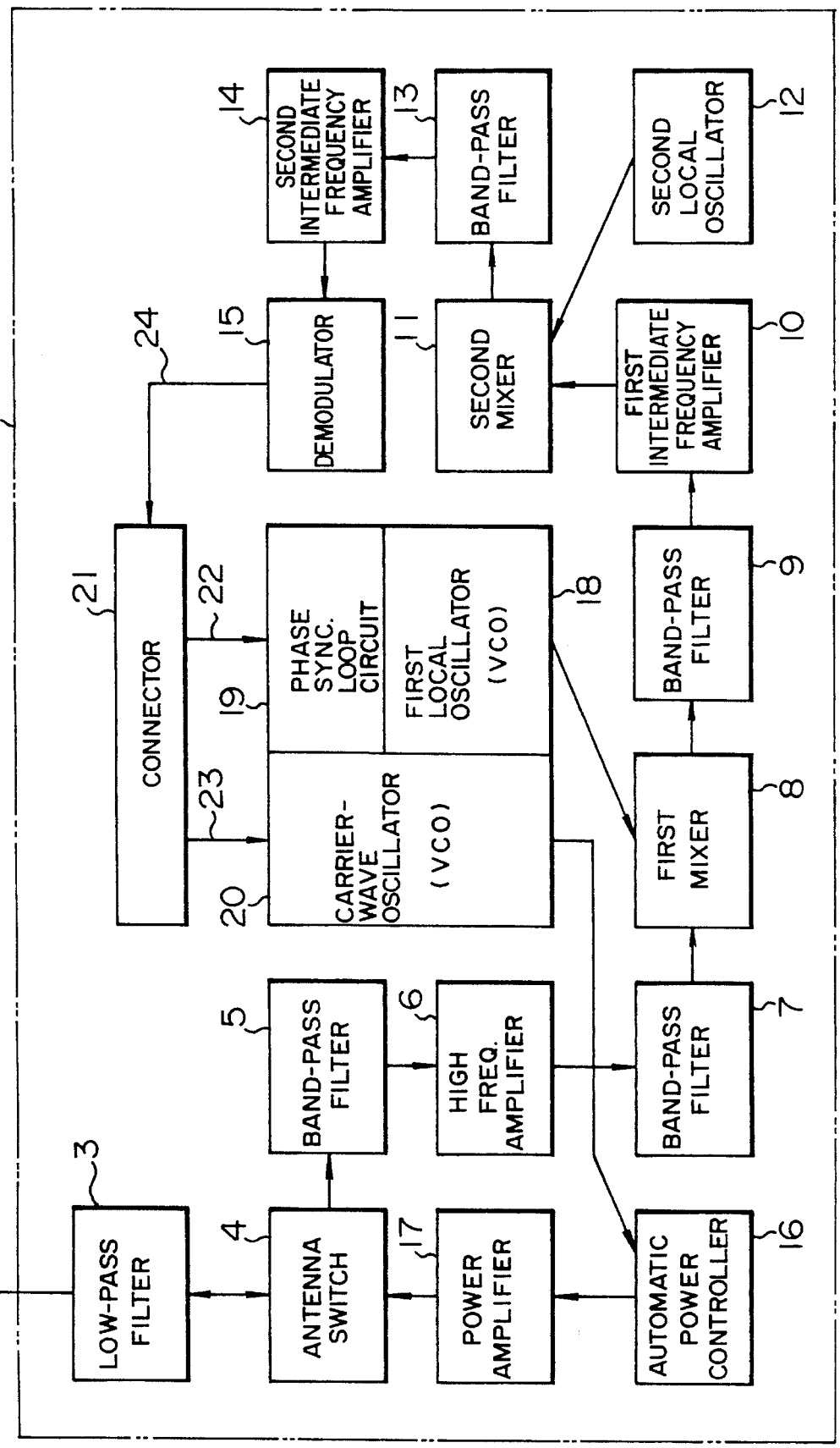
FIG. 3 is a circuit block diagram of a conventional radio apparatus.

An embodiment of the invention will be described with reference to the accompanying drawings. FIG. 1 shows one embodiment of the radio apparatus of the invention in which functional elements are disposed on the circuit board. In FIG. 1, like elements corresponding to those in FIG. 3 are identified by the same reference numerals. In addition, the operations of the receiver and transmitter are the same as shown in FIG. 3, and will not be described in detail here.

The circuit board 1 shown in FIG. 1 has dimensions of, for example, 62 mm×46 mm which is about ⅔ as small as the size of the conventional circuit board shown in FIG. 3. On this circuit board 1, there are disposed the low-pass filter 3, the antenna switch 4, the band-pass filter 5, the high-frequency amplifier 6, the band-pass filter 7 and the first mixer 8 which constitute the receiver's high-frequency section are disposed substantially in a straight line. In addition, the first mixer 8, the band-pass filter 9, the first intermediate frequency amplifier 10 and the second mixer 11 which constitute the first intermediate frequency section are disposed substantially in a straight line, and the second mixer 11, the band-pass filter 13, the second intermediate frequency amplifier 14 and the demodulator 15 which constitute the second intermediate frequency section are disposed substantially in a straight line. In the receiver's high-frequency section on the circuit board 1, the high-frequency signal can flow along the straight line, and the circuits of this section can be connected together by the shortest possible signal lines. Therefore, the coupling coefficients between the signals at the input and output terminals of the circuits can be minimized, such that it is possible to prevent the attenuation characteristic deterioration of the band-pass filters 5 and 7 and the undesirable oscillation in the high-frequency amplifier 6, and thus the receiver's high-frequency section can be kept at the highest stability. Similarly, the first intermediate frequency section and second intermediate frequency section can also be kept at the highest stability.

In addition, the automatic power controller 16 and power amplifier 17 which constitute the transmitter are arranged on one side of substantially a parallelogram of which the four sides are respectively formed by the receiver's high-frequency section, the first intermediate frequency section, the second intermediate frequency section and the transmitter and which surrounds the first local oscillator 18 and the carrier-wave oscillator 20. Moreover, since the various circuits can be connected together by the shortest possible signal lines, self-oscillation or the like can be prevented from occurring. Furthermore, since the receiver's circuits are disposed far away from the transmitter's circuits, the interference between the transmitter and the receiver can be minimized, and thus the characteristics of the receiver's circuits can be prevented from being deteriorated.

Figure 2:
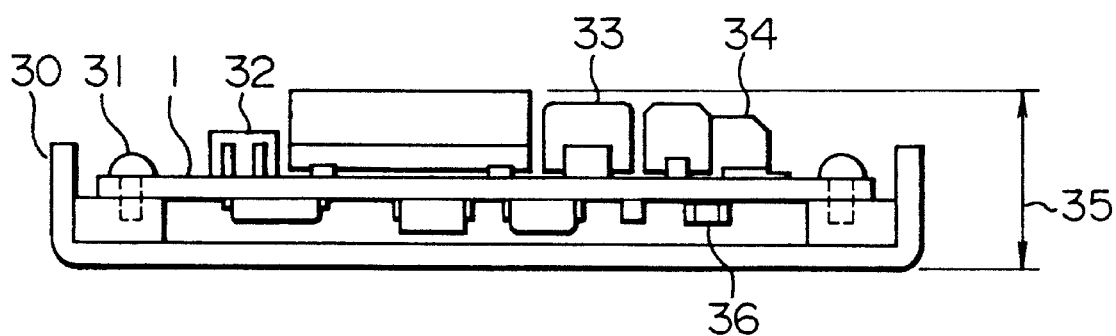
FIG. 2 is a cross-sectional view of the embodiment of the radio apparatus of the invention.

FIG. 2 is a cross-sectional view of the radio apparatus of the invention including the circuit board of the invention shown in FIG. 1. The circuit board 1 is fixed to the housing 30 with screws as in the prior art. On the other hand, the components such as the variable resistor 32 and the trimmer capacitor 33 which are necessary to adjust, and the large-height components 34 (for example, coils, capacitors, TXCO, various filters, power amplifiers and hybrid integrated circuits) are mounted only on one side (for example, the upper side) of the circuit board 1. In addition, only the small-height components 36 (for example, chip-type resistors, chip-type capacitors and thin-type integrated circuits chips) are mounted on the other side of the circuit board 1. Since the components which are necessary to adjust are mounted only on the upper side of the circuit board 1 as described above, it is not necessary to provide apertures for adjustment in the housing 30 or in the circuit board 1. In addition, since only the small-height components are mounted on the lower side of the circuit board 1, it is possible to minimize the distance between the circuit board 1 and the housing 30, and maximize the packaging density. This invention can reduce the thickness 35 of the whole radio apparatus to 9 mm, or about ½ that of the prior art apparatus shown in FIG. 4.

Figure 4:
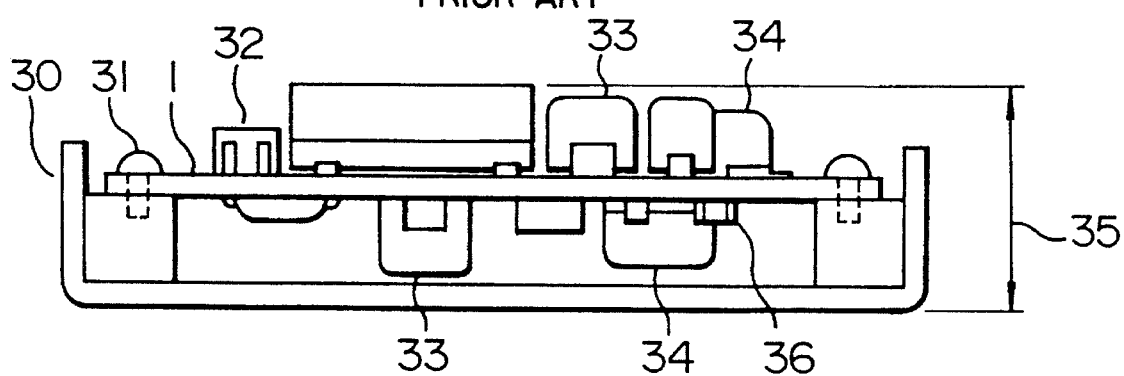
FIG. 4 is a cross-sectional view of the conventional radio apparatus.
Figure 5:
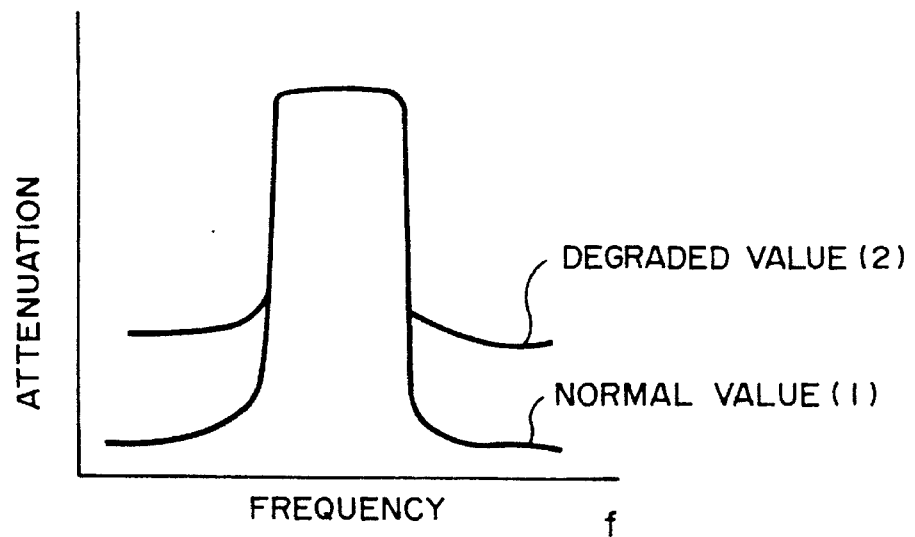
FIG. 5 is a graph showing the attenuation characteristics of the band-pass filters of the conventional radio apparatus.

Thus, according to this invention, the most effective use can be made of the performance of each circuit constituting the transmitter and receiver, and the mutual interference between the transmitter and the receiver can be eliminated so that the stability of the radio apparatus can be increased. Moreover, the adjustment becomes easy, and the cost is low. Furthermore, the volume of the conventional radio apparatus shown in FIGS. 3 and 4 is about 200 cc, while that of the invention shown in FIGS. 1 and 2 is about 80 cc, or less than half that of the conventional radio apparatus. In other words, the radio apparatus of the invention can be small-sized, and is particularly suitable for use as a portable radio apparatus.

What is claimed is:

1. A radio apparatus comprising:

a circuit board; and a housing having said circuit board mounted therein;

wherein said circuit board has disposed thereon an antenna portion, a receiving portion, and a transmitting portion; and wherein a first local oscillator of the receiving portion and a carrier-wave oscillator of the transmitting portion are disposed substantially at a center of said circuit board, and a high-frequency section of the receiving portion, a first intermediate frequency section of the receiving portion, a second intermediate frequency section of the receiving portion, and the transmitting portion are disposed on said circuit board so as to surround said first local oscillator and said carrier-wave oscillator.

2. A radio apparatus according to claim 1, wherein at least one of said high-frequency section, said first intermediate frequency section, and said second intermediate frequency section is formed of components which are arranged substantially in a straight line.

3. A radio apparatus according to claim 2, wherein said high-frequency section is disposed on a first side of a parallelogram, said first intermediate frequency section is disposed on a second side of said parallelogram, and said second intermediate frequency section is disposed on a third side of said parallelogram.

4. A radio apparatus according to claim 3, wherein said transmitting portion is disposed on a fourth side of said parallelogram.

5. A radio apparatus according to claim 2, wherein said high-frequency section and said first intermediate frequency section share a first mixer disposed at a first corner of said parallelogram, and said first intermediate frequency section and said second intermediate frequency section share a second mixer disposed at a second corner of said parallelogram.

6. A radio apparatus according to claim 3, wherein said high-frequency section and said first intermediate frequency section share a first mixer disposed at a first corner of said parallelogram, and said first intermediate frequency section and said second intermediate frequency section share a second mixer disposed at a second corner of said parallelogram.

7. A radio apparatus according to claim 4, wherein said high-frequency section and said first intermediate frequency section share a first mixer disposed at a first corner of said parallelogram, and said first intermediate frequency section and said second intermediate frequency section share a second mixer disposed at a second corner of said parallelogram.

8. A radio apparatus according to claim 1, wherein said transmitting portion and said receiving portion include adjustable components having an adjustable electrical characteristic, and said adjustable components are disposed only on one side of said circuit board.

9. A radio apparatus according to claim 1, wherein said transmitting portion and said receiving portion include small-height components and large-height components, the small-height components are disposed only on a first surface of said circuit board, and the large-height components are disposed only on a second surface of said circuit board.

10. A radio apparatus comprising:

a circuit board; and a housing having the circuit board mounted therein;

wherein the circuit board has disposed thereon an antenna portion, a receiving portion, and a transmitting portion;

wherein the transmitting portion is coupled to the antenna portion and includes a carrier-wave oscillator;

wherein the receiving portion includes a high-frequency section coupled to the antenna portion, a first intermediate frequency section coupled to the high-frequency section, a second intermediate frequency section coupled to the first intermediate frequency section, and a first local oscillator coupled to the high-frequency section and the first intermediate frequency section;

wherein the high-frequency section, the first intermediate frequency section, the second intermediate frequency section, and the transmitting portion are disposed on the circuit board so as to surround the first local oscillator and the carrier-wave oscillator; and wherein the high-frequency section, the first intermediate frequency section, and the second intermediate frequency section each include a filter having an input terminal and an output terminal, and an amplifier having an input terminal and an output terminal, wherein the input terminal of the amplifier is coupled to the output terminal of the filter, and wherein the input terminal of the filter, the output terminal of the filter, the input terminal of the amplifier, and the output terminal of the amplifier are arranged substantially in a straight line such that a distance between the input terminal of the filter and the output terminal of the filter is maximized and a distance between the input terminal of the amplifier and the output terminal of the amplifier is maximized.

11. A radio apparatus according to claim 10, wherein the high-frequency section is disposed on a first side of a parallelogram, the first intermediate frequency section is disposed on a second side of the parallelogram, the second intermediate frequency section is disposed on a third side of the parallelogram, and the transmitting portion is disposed on a fourth side of the parallelogram.

12. A radio apparatus according to claim 10, wherein the high-frequency section and the first intermediate frequency section share a first mixer, the first mixer being coupled to the first local oscillator, the output terminal of the amplifier of the high-frequency section, and the input terminal of the filter of the first intermediate frequency section; and wherein the first intermediate frequency section and the second intermediate frequency section share a second mixer, the second mixer being coupled to the output terminal of the amplifier of the first intermediate frequency section and the input terminal of the filter of the second intermediate frequency section.

13. A radio apparatus according to claim 12, wherein the high-frequency section is disposed on a first side of a parallelogram, the first intermediate frequency section is disposed on a second side of the parallelogram, the second intermediate frequency section is disposed on a third side of the parallelogram, the transmitting portion is disposed on a fourth side of the parallelogram, the first mixer is disposed at a first corner of the parallelogram where the first side of the parallelogram meets the second side of the parallelogram, and the second mixer is disposed at a second corner of the parallelogram where the second side of the parallelogram meets the third side of the parallelogram.

14. A radio apparatus according to claim 10, wherein the transmitting portion and the receiving portion include adjustable components having an adjustable electrical characteristic disposed only on one surface of the circuit board.

15. A radio apparatus according to claim 10, wherein the transmitting portion and the receiving portion include small-height components disposed only on a first surface of the circuit board, and large-height components disposed only on a second surface of the circuit board.

* * * * *